(12) United States Patent
Suk et al.

(10) Patent No.: US 9,601,569 B1
(45) Date of Patent: Mar. 21, 2017

(54) SEMICONDUCTOR DEVICE HAVING A GATE ALL AROUND STRUCTURE

(71) Applicant: SAMSUNG ELECTRONICS CO., LTD., Suwon-si, Gyeonggi-do (KR)

(72) Inventors: Sung-Dae Suk, Seoul (KR); Kang-Ill Seo, Chungcheongbuk-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/961,378

(22) Filed: Dec. 7, 2015

(51) Int. Cl.
| | |
|---|---|
| H01L 29/06 | (2006.01) |
| H01L 29/78 | (2006.01) |
| H01L 29/423 | (2006.01) |
| H01L 29/08 | (2006.01) |
| H01L 27/12 | (2006.01) |

(52) U.S. Cl.
CPC ...... *H01L 29/0673* (2013.01); *H01L 27/1211* (2013.01); *H01L 29/0847* (2013.01); *H01L 29/42392* (2013.01); *H01L 29/785* (2013.01)

(58) Field of Classification Search
CPC ............ H01L 29/0673; H01L 27/1211; H01L 29/41775; H01L 29/42392; H01L 29/511; H01L 29/785; H01L 29/0847; H01L 29/66787; H01L 29/7858; H01L 29/66439; H01L 29/775
See application file for complete search history.

(56) References Cited

U.S. PATENT DOCUMENTS

| | | | |
|---|---|---|---|
| 7,183,159 B2 | 2/2007 | Rao et al. | |
| 7,494,850 B2 | 2/2009 | Anderson et al. | |
| 7,754,560 B2 | 7/2010 | Burnett et al. | |
| 7,790,553 B2 | 9/2010 | Zhu et al. | |
| 8,008,751 B2* | 8/2011 | Irisawa | H01L 21/84 |
| | | | 257/347 |
| 8,395,220 B2 | 3/2013 | Chang et al. | |
| 8,455,334 B2 | 6/2013 | Bangsaruntip et al. | |
| 8,487,355 B2 | 7/2013 | Doris et al. | |
| 8,536,009 B2 | 9/2013 | Javorka et al. | |
| 8,722,472 B2 | 5/2014 | Chang et al. | |
| 8,809,957 B2 | 8/2014 | Bangsaruntip et al. | |
| 8,940,558 B2 | 1/2015 | Haensch et al. | |
| 9,000,536 B2* | 4/2015 | Kuo | H01L 29/785 |
| | | | 257/328 |
| 2013/0240979 A1* | 9/2013 | Lim | H01L 29/66545 |
| | | | 257/327 |
| 2014/0239255 A1 | 8/2014 | Kang et al. | |
| 2014/0326955 A1 | 11/2014 | Barraud et al. | |
| 2015/0340293 A1* | 11/2015 | Cheng | H01L 21/823807 |
| | | | 438/283 |

* cited by examiner

Primary Examiner — Scott B Geyer

(74) Attorney, Agent, or Firm — F. Chau & Associates, LLC

(57) ABSTRACT

A semiconductor includes a substrate including a first region and a second region, a fin extending in a first direction in the first region of the substrate, wherein the fin includes a first semiconductor pattern and a second semiconductor pattern that are disposed on each other, a first wire pattern extending in a second direction in the second region of the substrate, a first gate electrode disposed on the fin, wherein the first gate electrode extends in a third direction that is different from the first direction, and a second gate electrode surrounding an outer perimeter of the first wire pattern and extending in a fourth direction that is different from the second direction.

20 Claims, 19 Drawing Sheets

SEMICONDUCTOR DEVICE HAVING A GATE ALL AROUND STRUCTURE

TECHNICAL FIELD

The present inventive concept relates to a semiconductor device. More particularly, the present inventive concept relates to a semiconductor device having a gate all around structure.

DISCUSSION OF THE RELATED ART

In an example scaling technique to increase the density of a semiconductor device, a gate all around structure has been developed. In the gate all around structure, a nanowire-shaped silicon body is formed on a substrate and a gate is formed to surround the silicon body.

Since the gate all around structure uses a three-dimensional (3D) channel, scaling is achieved. Further, current is controlled without increasing the length of the gate. In addition, a short channel effect (SCE) in which an electric potential of a channel region is affected by a drain voltage can be suppressed.

SUMMARY

According to an example embodiment of the present inventive concept, a semiconductor device includes a substrate including a first region and a second region, a fin extending in a first direction in the first region of the substrate, wherein the fin includes a first semiconductor pattern and a second semiconductor pattern that are disposed on each other, a first wire pattern extending in a second direction in the second region of the substrate, a first gate electrode disposed on the fin, wherein the first gate electrode extends in a third direction that is different from the first direction, and a second gate electrode surrounding an outer perimeter of the first wire pattern and extending in a fourth direction that is different from the second direction.

In an example embodiment of the present inventive concept, the first semiconductor pattern is disposed at a first height with respect to an upper surface of the substrate, the second semiconductor pattern is disposed at a second height with respect to the upper surface of the substrate, the second height is different from the first height, and the first wire pattern is disposed at the first height and includes the same material as the first semiconductor pattern.

In an example embodiment of the present inventive concept, a thickness of the first semiconductor pattern is equal to a thickness of the first wire pattern.

In an example embodiment of the present inventive concept, a width in which the first gate electrode and the fin overlap each other is different from a width in which the second gate electrode and the first wire pattern overlap each other.

In an example embodiment of the present inventive concept, the width in which the first gate electrode and the fin overlap each other is larger than the width in which the second gate electrode and the first wire pattern overlap each other.

In an example embodiment of the present inventive concept, a semiconductor device further includes a first source or drain arranged on first and second sides of the first gate electrode, and a second source or drain arranged on first and second sides of the second gate electrode, wherein the first source or drain includes an extension portion of the first semiconductor pattern and an extension portion of the second semiconductor pattern, and the second source or drain includes a third semiconductor pattern and a fourth semiconductor pattern that are disposed on each other.

In an example embodiment of the present inventive concept, the substrate further includes a third region, and the semiconductor device further comprises a second wire pattern extending in a fifth direction on the third region and a third gate electrode surrounding an outer perimeter of the second wire pattern and extending in a sixth direction that is different from the fifth direction.

In an example embodiment of the present inventive concept, the first semiconductor pattern is disposed at a first height with respect to an upper surface of the substrate, the second semiconductor pattern is disposed at a second height with respect to the upper surface of the substrate, the second height is different from the first height, the first wire pattern is disposed at the first height and includes the same material as the first semiconductor pattern, and the second wire pattern is disposed at the second height and includes the same material as the second semiconductor pattern.

In an example embodiment of the present inventive concept, the first wire pattern and the second wire pattern include different materials.

In an example embodiment of the present inventive concept, a thickness of the first semiconductor pattern is equal to a thickness of the first wire pattern, and a thickness of the second semiconductor pattern is equal to a thickness of the second wire pattern.

In an example embodiment of the present inventive concept, a width in which the first gate electrode and the fin overlap each other is different from a width in which the second gate electrode and the first wire pattern overlap each other, and wherein the width in which the first gate electrode and the fin overlap each other is different from a width in which the third gate electrode and the second wire pattern overlap each other.

According to an example embodiment of the present inventive concept, a semiconductor device includes a substrate including a first region and a second region, a fin extending in a first direction in the first region of the substrate, wherein the fin includes a first semiconductor pattern and a second semiconductor pattern, a wire pattern extending in a second direction in the second region of the substrate, a first gate electrode disposed on the fin, wherein the first gate electrode extends in a third direction that is different from the first direction, and a second gate electrode surrounding an outer perimeter of the wire pattern and extending in a fourth direction that is different from the second direction, wherein a width of the second gate electrode is different from a width of the first gate electrode.

In an example embodiment of the present inventive concept, the width of the first gate electrode is larger than the width of the second gate electrode.

In an example embodiment of the present inventive concept, the first semiconductor pattern is disposed at a first height with respect to an upper surface of the substrate, the second semiconductor pattern is disposed at a second height with respect to the upper surface of the substrate, the second height is different from the first height, and the first wire pattern is disposed at the first height and includes the same material as the first semiconductor pattern.

In an example embodiment of the present inventive concept, a thickness of the first semiconductor pattern is equal to a thickness of the first wire pattern.

According to an example embodiment of the present inventive concept, a semiconductor device includes a substrate including a first region and a second region, a fin extending in a first direction in the first region of the substrate, wherein the fin includes a first semiconductor pattern disposed on the substrate, a second semiconductor pattern disposed on the first semiconductor pattern, a third semiconductor pattern disposed on the second semiconductor pattern, a fourth semiconductor pattern disposed on the third semiconductor pattern, and a fifth semiconductor pattern disposed on the fourth semiconductor pattern, a first wire pattern extending in a second direction in the second region of the substrate, a first gate electrode disposed on the fin, wherein the first gate electrode extends in a third direction that is different from the first direction, and a second gate electrode surrounding a circumference of the first wire pattern and extending in a fourth direction that is different from the second direction.

In an example embodiment of the present inventive concept, the third semiconductor pattern is disposed at a first height with respect to an upper surface of the substrate, the fourth semiconductor pattern is disposed at a second height with respect to the upper surface of the substrate, the second height is different from the first height, and the first wire pattern is disposed at the first height and includes the same material as the third semiconductor pattern.

In an example embodiment of the present inventive concept, a width of an area where the first gate electrode and the fin overlap each other is different from a width of an area where the second gate electrode and the first wire pattern overlap each other.

In an example embodiment of the present inventive concept, a semiconductor device further includes a first source or drain arranged on first and second sides of the first gate electrode, and a second source or drain arranged on first and second sides of the second gate electrode, wherein the first source or drain includes an extension portion of the first semiconductor pattern, an extension portion of the second semiconductor pattern, an extension portion of the third semiconductor pattern, an extension portion of the fourth semiconductor pattern, and an extension portion of the fifth semiconductor pattern, and the second source or drain includes a sixth semiconductor pattern and a seventh semiconductor pattern disposed on the sixth semiconductor pattern.

In an example embodiment of the present inventive concept, a semiconductor device further includes a second wire pattern extending in a fifth direction on a third region of the substrate and a third gate electrode surrounding a circumference of the second wire pattern and extending in a sixth direction that is different from the fifth direction.

BRIEF DESCRIPTION OF THE DRAWINGS

The above and other features of the present inventive concept will become more apparent by describing in detail example embodiments of the present inventive concept in conjunction with the accompanying drawings, in which.

DETAILED DESCRIPTION OF THE EMBODIMENTS

Figure 1:
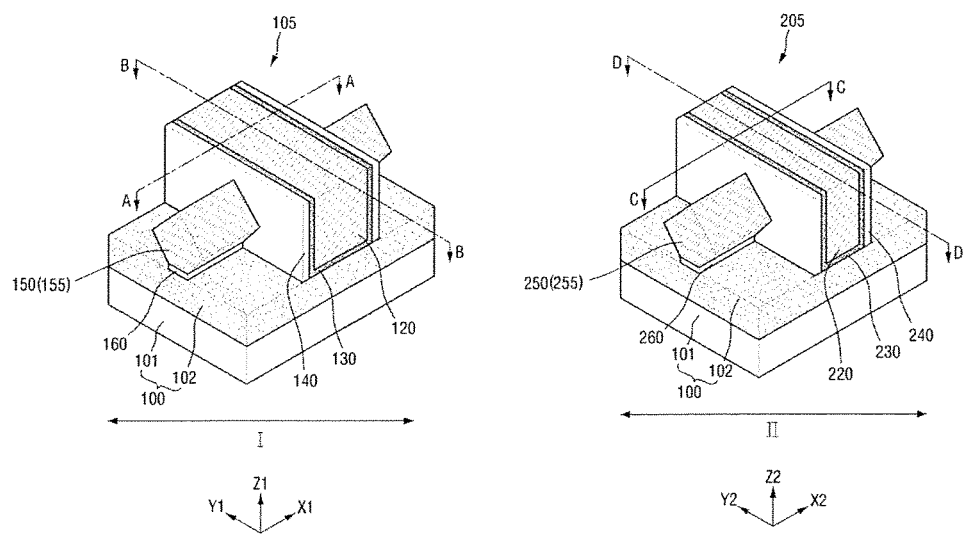
FIG. 1 is a perspective view illustrating a semiconductor device according to an example embodiment of the present inventive concept.

Example embodiments of the present inventive concept will now be described more fully hereinafter with reference to the accompanying drawings. The present inventive concept may, however, be embodied in many different forms and should not be construed as being limited to the embodiments set forth herein. Like reference numerals may refer to like elements throughout the specification.

As used herein, the singular forms "a", "an", and "the" are intended to include the plural forms as well, unless the context clearly indicates otherwise.

It will be understood that when an element or layer is referred to as being "on", "connected to", or "coupled to" another element or layer, it may be directly on, connected or coupled to the other element or layer, or intervening elements or layers may be present.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. In addition, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Hereinafter, referring to FIGS. 1 to 3, a semiconductor device according to an example embodiment of the present inventive concept will be described.

FIG. 1 is a perspective view illustrating a semiconductor device according to an example embodiment of the present inventive concept. FIG. 2 is a cross-sectional view taken along lines A-A and C-C of FIG. 1, according to an example embodiment of the present inventive concept. FIG. 3 is a cross-sectional view taken along lines B-B and D-D of FIG. 1, according to an example embodiment of the present inventive concept. For convenience in explanation, an interlayer insulating layer 190 is not illustrated in FIG. 1.

Figure 2:
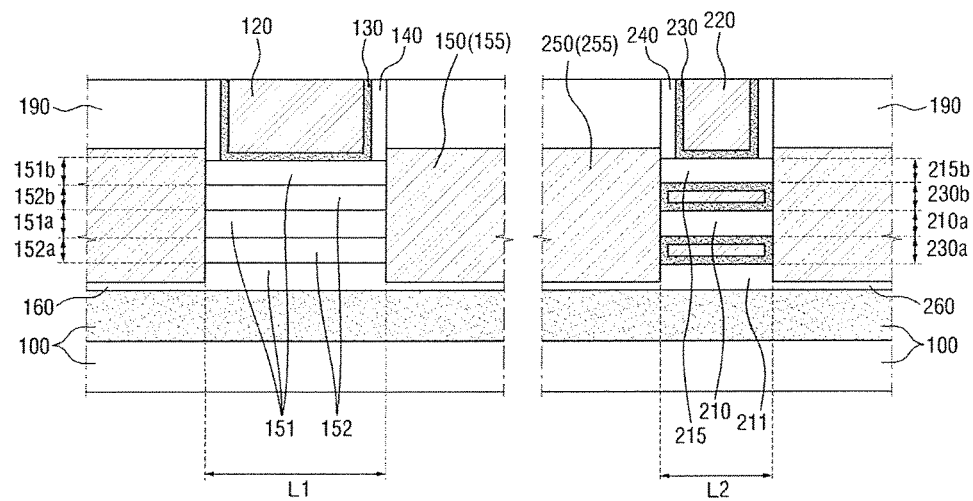
FIG. 2 is a cross-sectional view taken along lines A-A and C-C of FIG. 1, according to an example embodiment of the present inventive concept.
Figure 3:
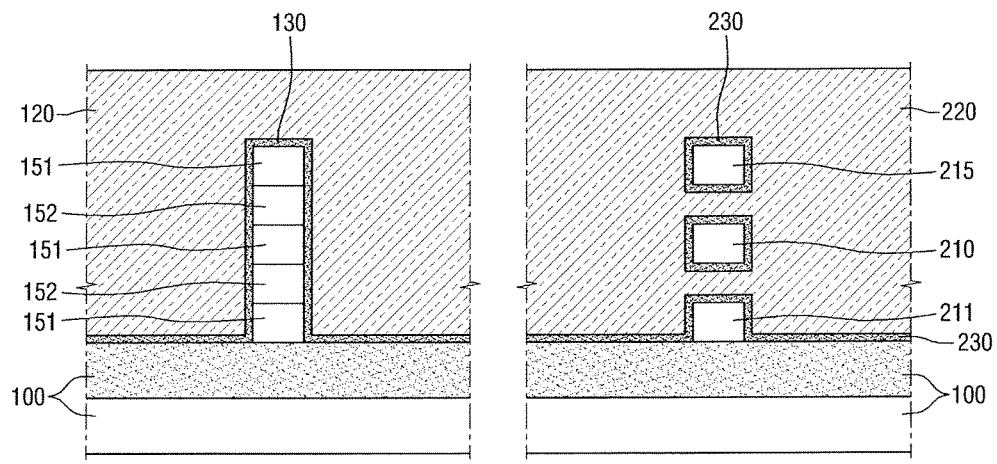
FIG. 3 is a cross-sectional view taken along lines B-B and D-D of FIG. 1, according to an example embodiment of the present inventive concept.

Referring to FIGS. 1 to 3, a semiconductor device, according to an example embodiment of the present inventive concept, may include a substrate 100, a fin 151 and 152, a first wire pattern 210, a third wire pattern 215, a first gate electrode 120, a second gate electrode 220, a first gate insulating layer 130, a second gate insulating layer 230, a first gate spacer 140, a second gate spacer 240, a first source/drain 150, and a second source/drain 250. Further, the fin 151 and 152 may include a first semiconductor pattern 151 and a second semiconductor pattern 152, respectively. Hereinafter, 151 may refer to the first semiconductor pattern 151 and the fin made thereof. 152 may refer to the second semiconductor pattern 152 and the fin made thereof.

The substrate 100 may include a first region I and a second region II. The first region I and the second region II may be regions which are spaced apart from each other or may be regions which are connected to each other. The second region II may be a logic region or a static random-access memory (SRAM) forming region, and the first region I may be a region in which a memory that is different from the memory formed in the logic region (e.g., a dynamic random-access memory (DRAM), a magnetoresistive random-access memory (MRAM), a resistive random-access memory (RRAM), or a phase change random-access memory (PRAM)) is formed, but is not limited thereto. Accordingly, at least one of the first region I and the second region II may be the logic region or the SRAM forming region.

Further, for example, the first region I may include a P-type transistor region, and the second region II may include an N-type transistor region. A first transistor 105 may be a P-type transistor, and a second transistor 205 may be an N-type transistor. Accordingly, the first transistor 105 may be formed in the first region I, and the second transistor 205 may be formed in the second region II. However, the present inventive concept is not limited thereto. For example, the first region I may include an N-type transistor region and the second region II may include a P-type transistor region.

The substrate 100 may be made of, for example, bulk silicon or Silicon-On-Insulator (SOI). The substrate 100 may be a silicon substrate, or may include another material, such as silicon germanium, indium antimonide, lead telluride, indium arsenide, indium phosphide, gallium arsenide, or gallium antimonide. Further, the substrate 100 may be provided by forming an epitaxial layer on a base substrate.

In a semiconductor device according to an example embodiment of the present inventive concept, the substrate 100 may include a lower substrate 101 and an upper substrate 102 that is formed on one surface of the lower substrate 101. For example, the lower substrate 101 may be a semiconductor substrate, and the upper substrate 102 may be an insulating layer substrate. The substrate 100 may include a semiconductor substrate and an insulating layer substrate that is formed on one surface of the semiconductor substrate, and for example, may be made of SOI.

The first transistor 105 may include the fin 151 and 152, the first gate electrode 120, the first gate insulating layer 130, the first gate spacer 140, and the first source/drain 150.

The second transistor 205 may include the first wire pattern 210, the second gate electrode 220, the second gate insulating layer 230, the second gate spacer 240, and the second source/drain 250.

The fin 151 and 152 may be formed on the substrate 100. The fin 151 and 152 may be formed to extend in a first direction X1. The fin 151 and 152 may have a structure in which the first semiconductor pattern 151 and the second semiconductor pattern 152 are laminated to cross each other, and may be formed on the upper substrate 102. For example, the first semiconductor pattern 151 and the second semiconductor pattern 152 may be stacked on each other. In an example embodiment of the present inventive concept, it is illustrated that the fin 151 and 152 includes three first semiconductor patterns 151 and two second semiconductor patterns 152. However, the present inventive concept is not limited thereto.

The first semiconductor pattern 151 included in the fin 151 and 152 may include Si or a group III-V compound semiconductor, and the second semiconductor pattern 152 may include SiGe or Ge. However, the present inventive concept is not limited thereto. For example, the first semiconductor pattern 151 may include SiGe or Ge, and the second semiconductor pattern 152 may include Si or a group compound semiconductor.

The first wire pattern 210 and the third wire pattern 215 may be formed on the substrate 100. The first wire pattern 210 and the third wire pattern 215 may be formed to extend in a third direction X2. The first wire pattern 210 may be formed on the upper substrate 102 to be spaced apart from the upper substrate 102.

The second transistor 205 may further include a dummy wire pattern 211 that is formed between the substrate 100 and the first wire pattern 210. The dummy wire pattern 211 is formed to extend in the third direction X2. The dummy wire pattern 211 may come in contact with the substrate 100. The dummy wire pattern 211 may come in direct contact with the upper substrate 102 of the substrate 100.

The first wire pattern 210 and the third wire pattern 215 may include the same material as the material of the first semiconductor pattern 151 or the second semiconductor pattern 152. In an example embodiment of the present inventive concept, the first wire pattern 210 and the third wire pattern 215 may include the same material as the material of the first semiconductor pattern 151. However, the present inventive concept is not limited thereto. The first wire pattern 210 and the third wire pattern 215 may include, for example, a material having an etch selectivity over that of the second semiconductor pattern 152.

Since the second transistor 205 may be an N-type transistor, the first wire pattern 210 that is included in the second transistor 205 may include, for example, a material having high electron mobility. The first wire pattern 210 may include, for example, Si or a group III-V compound semiconductor. However, the present inventive concept is not limited thereto.

The group III-V compound semiconductor may be made of a binary compound formed through a combination of a group III element, such as aluminum (Al), gallium (Ga), or indium (In), and a group V element, such as phosphorus (P), arsenide (As), or antimony (Sb), a ternary compound, or a quaternary compound.

The dummy wire pattern 211 may include the same material as the material of the first wire pattern 210. The dummy wire pattern 211 may include, for example, Si or a group III-V compound semiconductor.

FIG. 3 illustrates that the cross-sections of the fin 151 and 152, the first wire pattern 210, and the third wire pattern 215 may be in the form of a rectangle. However, the present inventive concept is not limited thereto. Corner portions of the fin 151 and 152, the first wire pattern 210, and the third wire pattern 215 may be rounded through a trimming process.

In a semiconductor device according to an example embodiment of the present inventive concept, the first semiconductor pattern 151, the first wire pattern 210, and the third wire pattern 215 may include the same material. The first semiconductor pattern 151 may have the same height from the substrate 100 as the first wire pattern 210. In addition, the first semiconductor pattern 151 may have the same height from the substrate 100 as the third wire pattern 215. Further, the first semiconductor pattern 151, the first wire pattern 210, and the third wire pattern 215 may have the same thickness. For example, the thickness of the first semiconductor pattern 151, the thickness of the first wire pattern 210, and the thickness of the third wire pattern 215 may be measured along a direction that is perpendicular to the surface of the substrate 100.

Referring to FIG. 2, respective semiconductor patterns that are included in the fin 151 and 152 may have a first thickness 152a, a second thickness 151a, a third thickness 152b, and a fourth thickness 151b. For example, the first semiconductor pattern 151 may have the second thickness 151a and the fourth thickness 151b, and the second semiconductor pattern 152 may have the first thickness 152a and the third thickness 152b. The first thickness 152a, the second thickness 151a, the third thickness 152b, and the fourth thickness 151b may be equal to one another or may be different from one another, or only parts thereof may be equal to one another. The first thickness 152a, the second thickness 151a, the third thickness 152b, and the fourth thickness 151b may form a structure or structures with a particular height through lamination. For example, the first thickness 152a and the second thickness 151a may form a first height from the substrate 100. However, the present inventive concept is not limited thereto.

In the second region II, a fifth thickness 230a, a sixth thickness 210a, a seventh thickness 230b, and an eighth thickness 215b may be arranged between the substrate 100 and the second gate insulating layer 230. For example, the first wire pattern 210 may have the sixth thickness 210a, and the third wire pattern 215 may have the eighth thickness 215b. The fifth thickness 230a, the sixth thickness 210a, the seventh thickness 230b, and the eighth thickness 215b may be laminated to form a structure or structures with a particular height. For example, in the second region II, the fifth thickness 230a and the sixth thickness 210a may form the first height from the substrate 100. However, the present inventive concept is not limited thereto.

In an example embodiment of the present inventive concept, the thicknesses that are arranged at the same level may be equal to each other. For example, the thicknesses that are arranged at the same level from the substrate 100, (e.g., the first thickness 152a and the fifth thickness 230a, the second thickness 151a and the sixth thickness 210a, the third thickness 152b and the seventh thickness 230b, or the fourth thickness 151b and the eighth thickness 215b), may be equal to each other. However, the present inventive concept is not limited thereto.

Further, in an example embodiment of the present inventive concept, a first length L1 of the fin 151 and 152 that extends in the first direction X1 may be longer than a second length L2 of the first wire pattern 210 that extends in a second direction X2.

Further, in an example embodiment of the present inventive concept, as illustrated in FIG. 2, the first length L1 may be a width with which the first gate electrode 120 and the fin 151 and 152 overlap each other. Further, the first distance L1 may be a gap distance of the first source/drain 150. In other words, the first distance L1 may correspond to the space between a source and a drain. As illustrated in FIG. 2, the second distance L2 may be a width with which the first wire pattern 210 and the second gate electrode 220 overlap each other. Further, the second distance L2 may be a gap distance of the second source/drain 250. In other words, the second distance L2 may correspond to the space between a source and a drain.

The first transistor 105 that is arranged in the first region I has a long channel length in comparison to the second transistor 205 that is arranged in the second region II. In other words, the channel length of the first transistor 105 is longer than the channel length of the second transistor 205. In a semiconductor device according to an example embodiment of the present inventive concept, since a transistor having a short channel length includes a nano-wire channel, a Short Channel Effect (SCE) may be suppressed. Further, since a transistor having a long channel length may include a channel having a fin structure, stability of the semiconductor device may be increased.

However, in an example embodiment of the present inventive concept, a transistor having a short channel length may be a transistor that is formed in the logic region and the SRAM forming region.

The first gate electrode 120 may be formed on the substrate 100. The first gate electrode 120 may be formed to extend lengthwise in a second direction Y1. The first gate electrode 120 may be formed on an upper surface and a side wall of the fin 151 and 152 that are formed to be spaced apart from the substrate 100.

The second gate electrode 220 may be formed on the substrate 100. The second gate electrode 220 is formed to extend lengthwise in a fourth direction Y2. The second gate electrode 220 may be formed to surround the entire circumference of the first wire pattern 210. Further, since the second gate electrode 220 may be formed on the upper surface and the side wall of the dummy wire pattern 211, the second gate electrode 220 is formed between the first wire pattern 210 and the dummy wire pattern 211.

The first gate electrode 120 and the second gate electrode 220 may include a conductive material. The first gate electrode 120 and the second gate electrode 220 are illustrated as single layers for convenience. However, the present inventive concept is not limited thereto. For example, each of the first gate electrode 120 and the second gate electrode 220 may include a work function conductive layer for adjusting a work function and a filling conductive layer that fills a space that is formed by the work function conductive layer.

The first gate electrode 120 and the second gate electrode 220 may include, for example, TiN, WN, TaN, Ru, TiC, TaC, Ti, Ag, Al, TiAl, TiAlN, TiAlC, TaCN, TaSiN, Mn, Zr, W, or Al. Further, the first gate electrode 120 and the second gate electrode 220 may be made of Si or SiGe that is not a metal. The first gate electrode 120 and the second gate electrode 220 as described above may be formed, for example, through a replacement process. However, the present inventive concept is not limited thereto.

The first gate spacer 140 may be formed on both side walls of the first gate electrode 120 that extends in the second direction Y1. The first gate spacer 140 may be formed on both sides of the fin 151 and 152. In other words, the first gate spacer 140 is formed on opposite sides of the fin 151 and 152 along the first direction X1.

The second gate spacer 240 may be formed on both side walls of the second gate electrode 220 that extends in a fourth direction Y2. The second gate spacer 240 may be formed on both sides of the first wire pattern 210 and the dummy wire pattern 211. In other words, the second gate spacer 240 is formed on opposite sides of the first wire pattern 210 and the dummy wire pattern 211.

The first gate spacer 140 and the second gate spacer 240 may include, for example, silicon nitride (SiN), silicon oxynitride (SiON), silicon oxide (SiO$_2$), silicon oxycarbonitride (SiOCN), or a combination thereof. The first gate spacer 140 and the second gate spacer 240 are illustrated as single layers. However, the present inventive concept is not limited thereto. The first gate spacer 140 and the second gate spacer 240 may have a multilayer structure.

The first gate insulating layer 130 may be formed between the fin 151 and 152 and the first gate electrode 120. The first gate insulating layer 130 may be formed between the first gate electrode 120 and the first gate spacer 140. Further, the first gate insulating layer 130 may be formed between the substrate 100 and the first gate electrode 120.

The first gate insulating layer 130 may be conformally formed along the upper surface and the side walls of the fin 151 and 152 and the side walls of the first gate electrode 120. The first gate insulating layer 130 may be formed along the upper surface of the substrate 100.

Since the first gate insulating layer 130 may be formed between the side walls of the first gate electrode 120 and the side walls of the first gate spacer 140, one side surface of the first gate insulating layer 130 may be formed along a side wall of the first gate electrode 120, and another side surface of the first gate insulating layer 130 may be formed along a side wall of the first gate spacer 140.

The second gate insulating layer 230 may be formed between the first wire pattern 210 and the second gate electrode 220, and between the dummy wire pattern 211 and the second gate electrode 220. Further, the second gate insulating layer 230 may be formed between the third wire pattern 215 and the first wire pattern 210.

The second gate insulating layer 230 may be formed between the second gate electrode 220 and the second gate spacer 240. Further, the second gate insulating layer 230 may be formed between the substrate 100 and the second gate electrode 220.

The second gate insulating layer 230 may be conformally formed along the circumference of the first wire pattern 210, the circumference of the third wire pattern 215, and the side walls of the second gate electrode 220. Further, the second gate insulating layer 230 may be conformally formed along the circumference of the first wire pattern 210, the circumference of the third wire pattern 215, and the side walls of the second gate spacer 240. The second gate insulating layer 230 may be formed along the upper surface of the substrate 100 and the side walls and the upper surface of the dummy wire pattern 211. In addition, the second gate insulating layer 230 may be formed along a to surface of a part of the second source/drain 250.

Since the second gate insulating layer 230 may be formed between the side walls of the second gate electrode 220 and the side walls of the second gate spacer 240, one side surface of the second gate insulating layer 230 may be formed along a side wall of the second gate electrode 220, and the other side surface of the second gate insulating layer 230 may be formed along a side wall of the second gate spacer 240.

The first gate insulating layer 130 and the second gate insulating layer 230 may include a high-k material having a dielectric constant that is higher than the dielectric constant of a silicon oxide layer. For example, the first gate insulating layer 130 and the second gate insulating layer 230 may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. However, the present inventive concept is not limited thereto.

The first transistor 105 may further include a first epitaxial seed layer 160 that is arranged on both sides of the first gate electrode 120 on the substrate 100. The second transistor 205 may further include a second epitaxial seed layer 260 that is arranged on both sides of the second gate electrode 220 on the substrate 100.

The second epitaxial seed layer 260 may be connected to the dummy wire pattern 211. For example, the second epitaxial seed layer 260 may be a portion that extends from the dummy wire pattern 211. The thickness of the second epitaxial seed layer 260 may be smaller than the thickness of the dummy wire pattern 211.

The first epitaxial seed layer 160 and the second epitaxial seed layer 260 may include the same material. Since the second epitaxial seed layer 260 may be the portion that extends from the dummy wire pattern 211, the first epitaxial seed layer 160 and the second epitaxial seed layer 260 may include the same material as the material of the dummy wire pattern 211.

The first epitaxial seed layer 160 and the second epitaxial seed layer 260 may be selective layers. Accordingly, the first epitaxial seed layer 160 and the second epitaxial seed layer 260 may be omitted.

The first source/drain 150 may be arranged on both sides of the first gate electrode 120. The first source/drain 150 is formed on the substrate 100, and may be connected to the fin 151 and 152.

The first source/drain 150 may include a first epitaxial layer 155 that is formed on the substrate 100. The first epitaxial layer 155 may be formed on the first epitaxial seed layer 160. For example, the first epitaxial seed layer 160 may be positioned between the first epitaxial layer 155 and the substrate 100.

The second source/drain 250 may be arranged on both sides of the second gate electrode 220. The second source/drain 250 may be formed on the substrate 100, and may be connected to the first wire pattern 210 that is a channel region. Further, the second source/drain 250 may be connected to the dummy wire pattern 211.

The second source/drain 250 may include a second epitaxial layer 255 that is formed on the substrate 100. The second epitaxial layer 255 may be formed on the second epitaxial seed layer 260. For example, the second epitaxial seed layer 260 may be positioned between the second epitaxial layer 255 and the substrate 100. A part of the second gate insulating layer 230 may come in contact with the second epitaxial layer 255.

An outer periphery of the first epitaxial layer 155 and an outer periphery of the second epitaxial layer 255 may have various shapes. For example, the outer periphery of the first epitaxial layer 155 and the outer periphery of the second epitaxial layer 255 may have a diamond shape, a circular shape, or a rectangular shape. FIG. 1 exemplarily illustrates a diamond shape (e.g., a pentagonal shape or a hexagonal shape).

For example, the first epitaxial layer 155 may include a material that can apply a compressive stress to the fin 151 and 152 that is used as a channel region of a P-type metal oxide semiconductor (PMOS) transistor. The first epitaxial layer 155 may include a material having higher lattice constant than that of the fin 151 and 152. When the fin 151 and 152 includes SiGe, the first epitaxial layer 155 may include SiGe having a Ge content that is higher than the Ge content of the fin 151 and 152. However, the present inventive concept is not limited thereto.

For example, the second epitaxial layer 255 may include a material that can apply a tensile stress to the first wire pattern 210 that is used as a channel region of an N-type metal oxide semiconductor (NMOS) transistor or the same material as the material of the first wire pattern 210. The second epitaxial layer 255 may include a material having a lattice constant that is lower than or equal to the lattice constant of the first wire pattern 210. When the first wire pattern 210 is made of Si, the second epitaxial layer 255 may be Si or a material (e.g., SiC) having a lattice constant that is lower than the lattice constant of Si.

Figure 4:
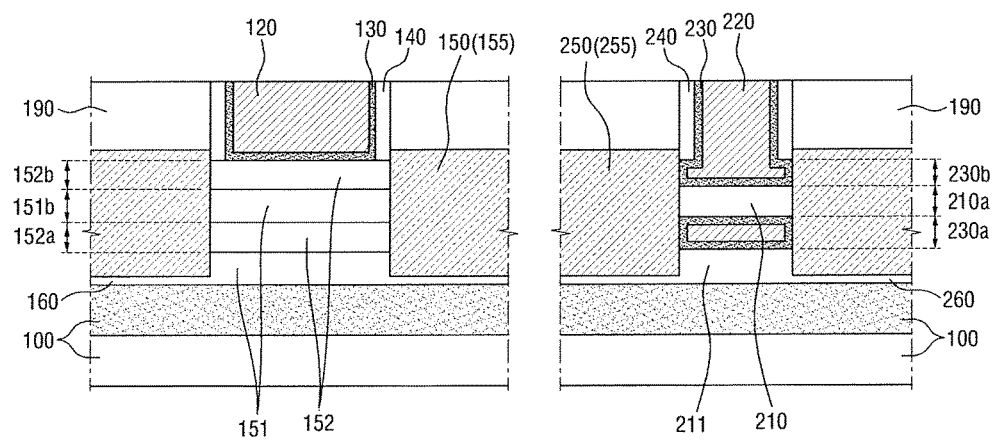
FIG. 4 is a view illustrating a semiconductor device, according to an example embodiment of the present inventive concept.

Referring to FIGS. 1, 2, and 4, the first gate insulating layer 130 may be formed along the entirety of the side walls of the first gate electrode 120, and the second gate insulting layer 230 may be formed along the entirety of the side walls of the second gate electrode 220.

The second gate insulting layer 230 may be interposed between the side walls of the second gate electrode 220 and the second gate spacer 240, and a part of the second gate insulating layer 230 may not come in contact with the second gate spacer 240, but may come in contact with the second epitaxial layer 255.

Accordingly, the second gate insulating layer 230 may include a portion that comes in contact with the second epitaxial layer 255, (e.g., the second source/drain 250), and a portion that comes in contact with the second gate spacer 240.

In FIGS. 1 to 3, it is described that the transistor that is formed in the first region I does not include the wire pattern and the transistor that is formed in the second region II includes the wire pattern. However, the present inventive concept is not limited thereto.

FIG. 4 is a view illustrating a semiconductor device, according to an example embodiment of the present inventive concept. For convenience in explanation, the description of FIG. 4 will focus on differences between FIGS. 1 to 3.

Referring to FIG. 4, a semiconductor device according to an example embodiment of the present inventive concept does not include a third wire pattern 215 that is formed in a second region II. For example, a second transistor 205 that is formed in the second region II does not include the third wire pattern 115, but includes a first wire pattern 210.

Further, a second gate insulating layer 230 and a second gate electrode 220 that may be formed in the second region II have different shapes in comparison to those described above with reference to FIGS. 1 to 3. For example, the second gate insulating layer 230 and the second gate electrode 220 according to an example embodiment of the present inventive concept may be arranged between a second gate spacer 240 and a first wire pattern 210.

In a first region I, a first gate insulating layer 130 and a second semiconductor pattern 152 come in direct contact with each other.

Figure 5:
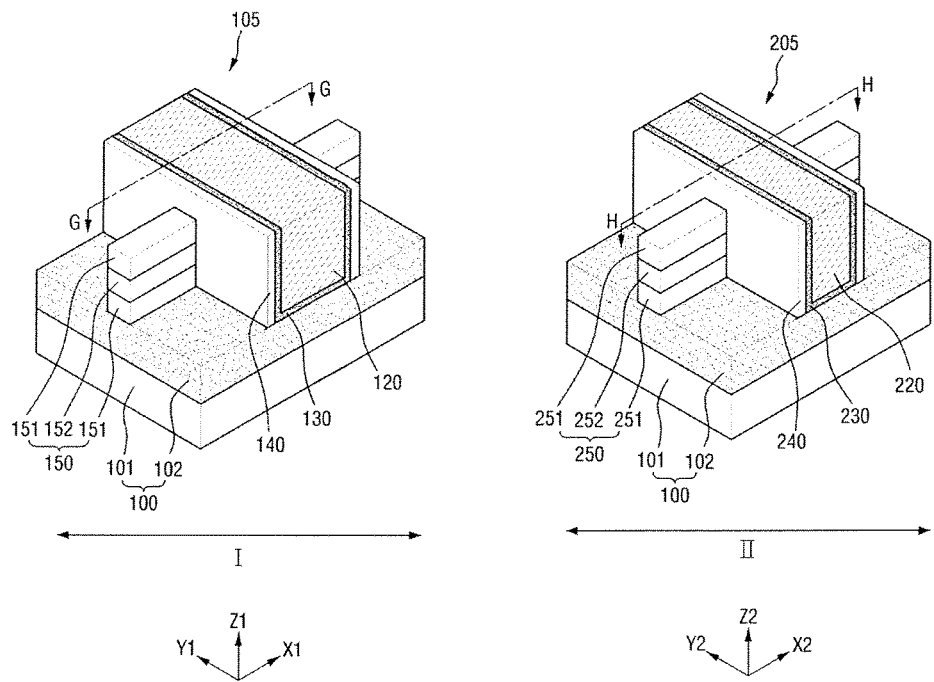
FIG. 5 is a perspective view illustrating a semiconductor device, according to an example embodiment of the present inventive concept.
Figure 6:
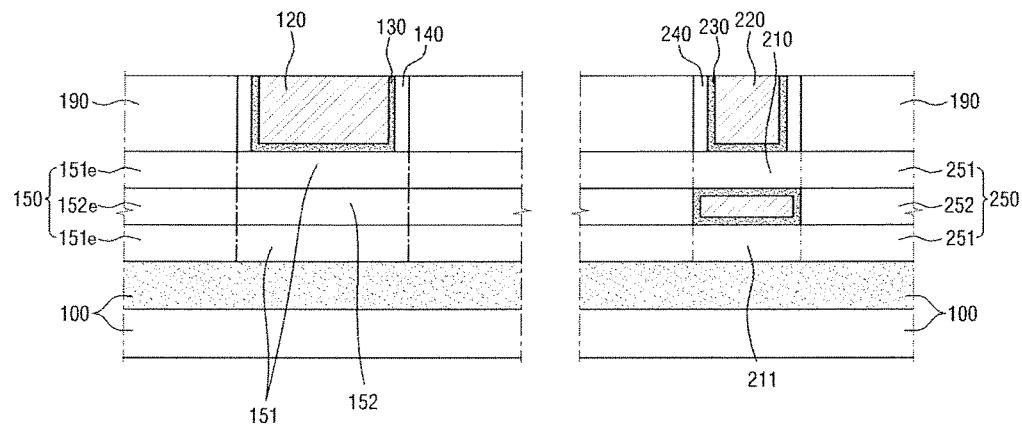
FIG. 6 is a cross-sectional view taken along lines G-G and H-H of FIG. 5, according to an example embodiment of the present inventive concept.

FIG. 5 is a perspective view illustrating a semiconductor device according to an example embodiment of the present inventive concept, and FIG. 6 is a cross-sectional view taken along lines G-G and H-H of FIG. 5, according to an example embodiment of the present inventive concept. For convenience in explanation, the description of FIGS. 5 and 6 will focus on differences between FIGS. 1 to 3.

Referring to FIGS. 5 and 6, in a semiconductor device according to an example embodiment of the present inventive concept, a first source/drain 150 may include a first semiconductor pattern extension portion 151e and a second semiconductor pattern extension portion 152e that are successively laminated on a substrate 100. An upper surface of the first source/drain 150 may be, for example, the first semiconductor pattern extension portion 151e.

A second source/drain 250 may include a third semiconductor pattern 251 and a fourth semiconductor pattern 252 that are successively laminated on the substrate 100. An upper surface of the second source/drain 250 may be a third semiconductor pattern 251.

The first semiconductor pattern extension portion 151e may be directly connected to a first semiconductor pattern 151 of the fin 151 and 152. For example, the first semiconductor pattern extension portion 151e may be a portion that extends from the first semiconductor pattern 151 of the fin 151 and 152.

The second semiconductor pattern extension portion 152e may be directly connected to a second semiconductor pattern 152 of the fin 151 and 152. For example, the second semiconductor pattern extension portion 152e may be a portion that extends from the second semiconductor pattern 152 of the fin 151 and 152.

The first semiconductor pattern extension portion 151e may be formed in the same manufacturing process as the manufacturing process of the first semiconductor patter 151 of the fin 151 and 152. The second semiconductor pattern extension portion 152e may be formed in the same manufacturing process as the manufacturing process of the second semiconductor pattern 152 of the fin 151 and 152.

The third semiconductor pattern 251 that comes in contact with the substrate 100 may be directly connected to a dummy wire pattern 211, and the third semiconductor pattern 251 that is spaced apart from the substrate 100 may be directly connected to the first wire pattern 210. For example, the third semiconductor pattern 251 may be a portion that extends from the dummy wire pattern 211 and the first wire pattern 210.

The fourth semiconductor pattern 252 may be arranged on both sides of the second gate electrode 220 in the third direction X2. The second gate electrode 220 and the second gate insulating layer 230 may be arranged between the fourth semiconductor patterns 252 arranged on both sides of the second gate electrode 220.

In a semiconductor device according to an example embodiment of the present inventive concept, the first semiconductor pattern 151, the first semiconductor pattern extension portion 151a, and the third semiconductor pattern 251 include the same material, and the second semiconductor pattern 152, the second semiconductor pattern extension portion 152a, and the fourth semiconductor pattern 252 include the same material.

A part of the second gate insulating layer 230 comes in contact with the second source/drain 250. In a semiconductor device according to an example embodiment of the present inventive concept, a part of the second gate insulating layer 230 comes in contact with the fourth semiconductor pattern 252 of the second source/drain 250.

Figure 7:
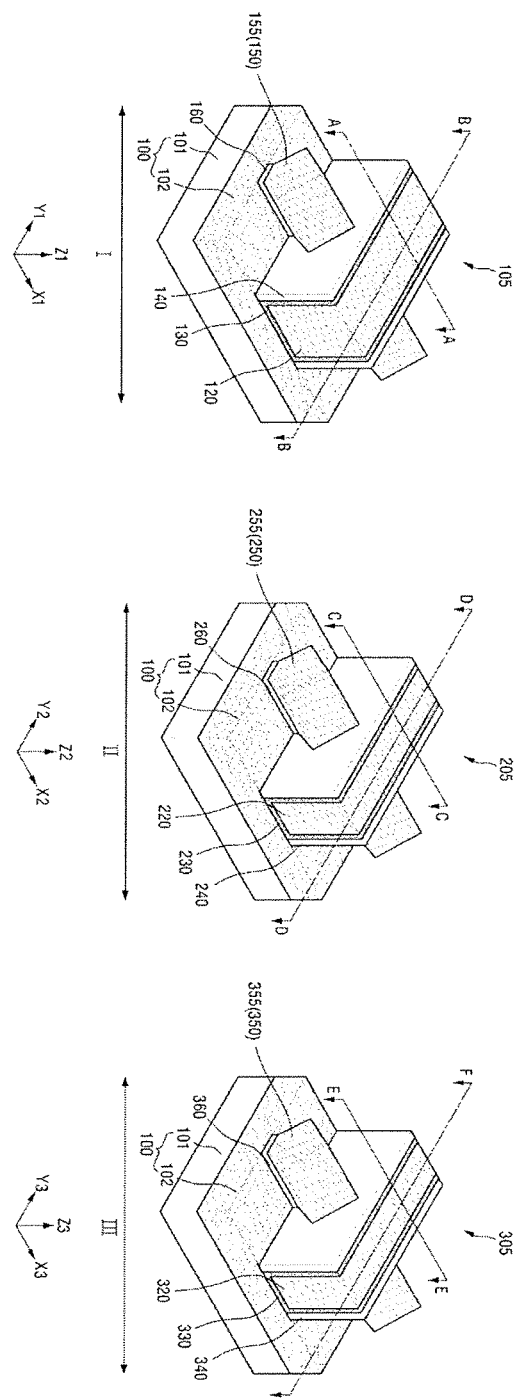
FIG. 7 is a perspective view illustrating a semiconductor device, according to an example embodiment of the present inventive concept.
Figure 8:
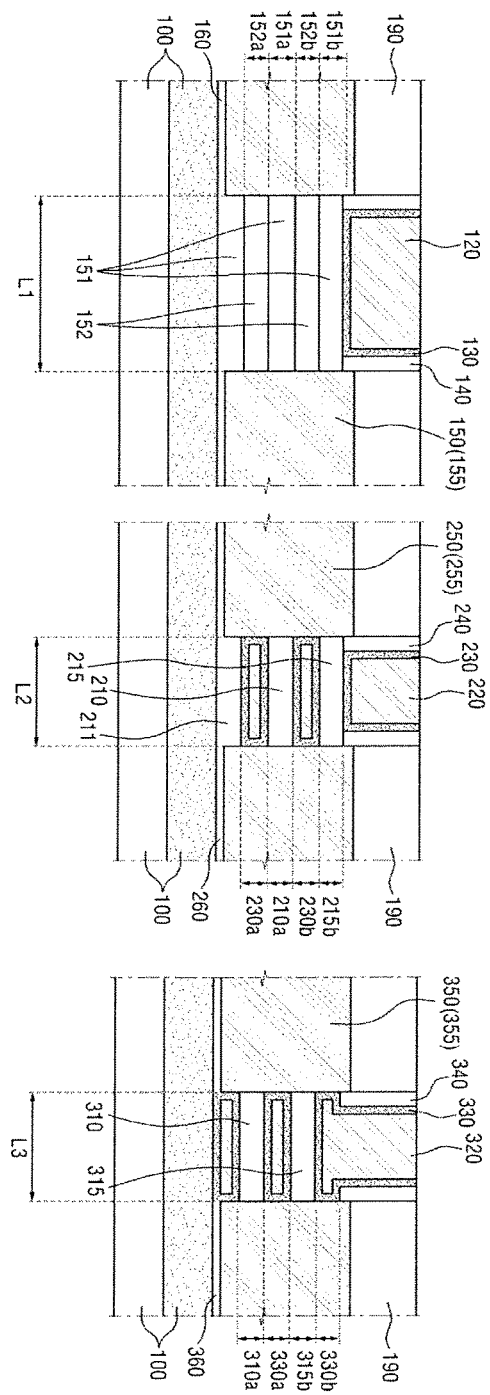
FIG. 8 is a cross-sectional view taken along lines A-A, C-C, and E-E of FIG. 7, according to an example embodiment of the present inventive concept.
Figure 9:
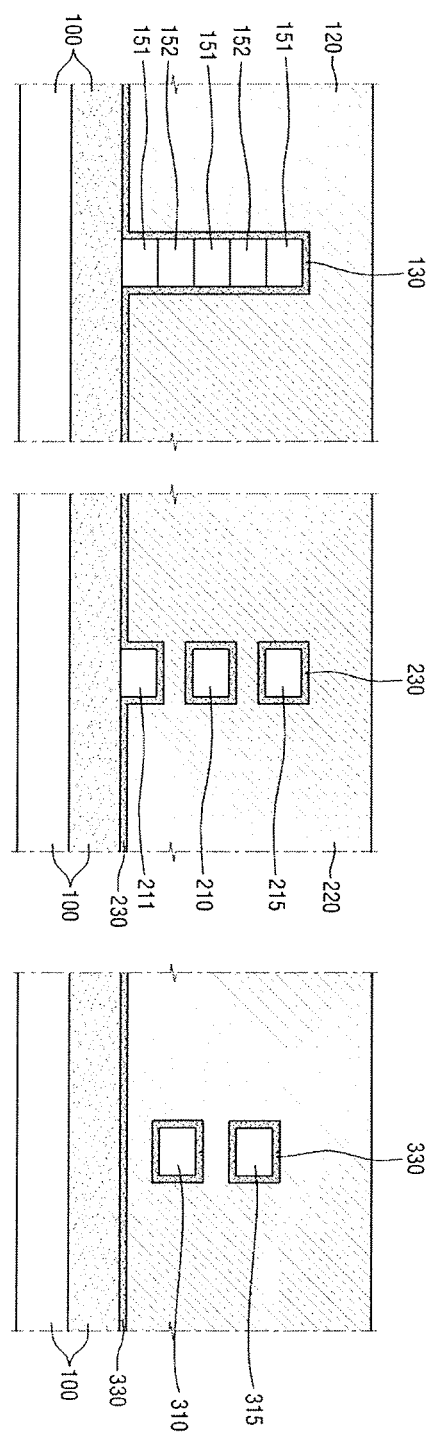
FIG. 9 is a cross-sectional view taken along lines B-B, D-D, and F-F of FIG. 7, according to an example embodiment of the present inventive concept.

Referring to FIGS. 7 to 9, a semiconductor device according to an example embodiment of the present inventive concept will be described.

FIG. 7 is a perspective view illustrating a semiconductor device according to an example embodiment of the present inventive concept. FIG. 8 is a cross-sectional view taken along lines A-A, C-C, and E-E of FIG. 7, according to an example embodiment of the present inventive concept. FIG. 9 is a cross-sectional view taken along lines B-B, D-D, and F-F of FIG. 7, according to an example embodiment of the present inventive concept.

Referring to FIGS. 7 to 9, a first transistor 105 is formed in a first region I, a second transistor 205 is formed in a second region II, and a third transistor 305 is formed in a third region III of a substrate 100.

The first transistor 105 and the second transistor 205 according to the current embodiment of the present inventive concept may be substantially the same as the first transistor 105 and the second transistor 205 described above with reference to FIGS. 1 to 3. Accordingly, for convenience in explanation, the description of FIGS. 7 to 9 will focus on differences between FIGS. 1 to 3.

In an example embodiment of the present inventive concept, the second region II and the third region III may be a logic region or an SRAM forming region. Further, the second region II may be a logic N-type field effect transistor (NFET) region, and the third region III may be a logic P-type field effect transistor (PFET) region. However, the present inventive concept is not limited thereto.

Referring to FIG. 8, the third transistor 305 may include a substrate 100, a second wire pattern 310, a fourth wire pattern 315, a third gate electrode 320, a third gate insulating layer 330, a third gate spacer 340, and a third source/drain 350.

The second wire pattern 310 may be arranged at the same height as the height of the second semiconductor pattern 152 having a first thickness 152a from the substrate 100, and the fourth wire pattern 315 may be arranged at the same height as the height of the second semiconductor pattern 152 having a third thickness 152b from the substrate 100.

In an example embodiment of the present inventive concept, the wire pattern and the semiconductor pattern that are arranged at the same height may be made of the same material. Accordingly, the second wire pattern 310 and the fourth wire pattern 315 may be made of the same material as that of the second semiconductor pattern 152.

The second wire pattern 310 and the fourth wire pattern 315 may be arranged at heights different from the heights of the first wire pattern 210 and the third wire pattern 215 from the substrate 100. In an example embodiment of the present inventive concept, the heights of the wire pattern and the semiconductor pattern may be measured from the upper surface of the substrate to middle points of the wire pattern and the semiconductor pattern.

Since the second transistor 205 may be an N-type transistor, the first wire pattern 210 and the third wire pattern 215 that are included in the second transistor 205 may include, for example, a material having high electron mobility. The first wire pattern 210 may include, for example, Si or a group III-V compound semiconductor. However, the present inventive concept is not limited thereto. The group III-V compound semiconductor may be made of a binary compound formed through combination of group III elements, such as aluminum (Al), gallium (Ga), or indium (In), and group V elements, such as phosphorus (P), arsenide (As), or antimony (Sb), a ternary compound, or a quaternary compound.

Since the third transistor 305 may be a P-type transistor, the second wire pattern 310 and the fourth wire pattern 315 that are included in the third transistor 305 may include, for example, a material having high electron mobility. The second wire pattern 310 and the fourth wire pattern 315 may include, for example, SiGe or Ge. However, the present inventive concept is not limited thereto.

In an example embodiment of the present inventive concept, the second wire pattern 310 and the fourth wire pattern 315 of the third transistor 305 extend in a fifth direction X3, and have a third length L3 in the fifth direction X3.

The third length L3 may be shorter than a first length L1 of the first transistor 105. The third length L3 may be equal to a second length L2 of the second transistor 205. However, the present inventive concept is not limited thereto. Accordingly, the third length L3 may be shorter than the first length L1, but may be longer than or shorter than the second length L2.

In an example embodiment of the present inventive concept, the second transistor 205 and the third transistor 305 include nano-wire channels. In the case where the second transistor 205 and the third transistor 305 have a channel length that is shorter than the channel length of the first transistor 105, reliability of a semiconductor device can be increased.

Referring to FIGS. 10 to 22, a method for fabricating a semiconductor device according to an example embodiment of the present inventive concept will be described. A semiconductor device that may be formed through processes of FIGS. 10 to 20 may be the semiconductor device described with reference to FIGS. 1 to 3.

FIGS. 10 to 22 are views illustrating steps of a method for fabricating a semiconductor device, according to an example embodiment of the present inventive concept. FIG. 18 is a cross-sectional view taken along lines G-G and H-H of FIG. 17.

Figure 10:
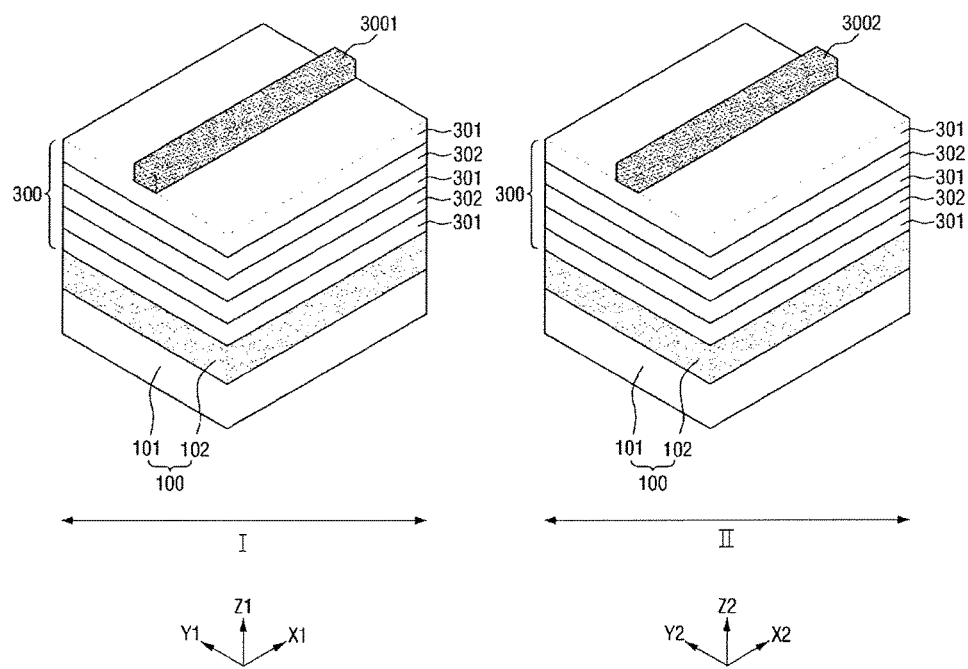
FIGS. 10, 11, 12, 13, 14, 15, 16, 17, 18, 19, 20, 21 and 22 are views illustrating steps of a method for fabricating a semiconductor device, according to an example embodiment of the present inventive concept.

Referring to FIG. 10, on a substrate 100, a laminated structure 300, in which a first semiconductor layer 301 and a second semiconductor layer 302 are alternately laminated, is formed.

The substrate 100 may include a lower substrate 101 that is a semiconductor substrate and an upper substrate 102 that is an insulating layer substrate.

In the laminated structure 300, the first semiconductor layer 301 that comes in contact with the substrate 100 may be a layer that is bonded to the substrate 100, for example, through a wafer bonding method. However, the present inventive concept is not limited thereto.

The second semiconductor layer 302 and the first semiconductor layer 301 may be alternately formed on the first semiconductor layer 301 that comes in contact with the substrate 100. The first semiconductor layer 301 and the second semiconductor layer 302 may be formed, for example, using an epitaxial growth method. However, the present inventive concept is not limited thereto. The uppermost layer of the laminated structure 300 may be, for example, the first semiconductor layer 301. However, the present inventive concept is not limited thereto.

The first semiconductor layer 301 and the second semiconductor layer 302 may include different materials. The first semiconductor layer 301 and the second semiconductor layer 302 may include materials having an etch selectivity over each other. The first semiconductor layer 301 may include, for example, Si or a group III-V compound semiconductor. However, the present inventive concept is not limited thereto. The second semiconductor layer 302 may include, for example, SiGe or Ge. However, the present inventive concept is not limited thereto.

Then, a first mask pattern 3001 that extends in a first direction X1 may be formed on the laminated structure 300 in a first region I of the substrate 100. Further, a second mask pattern 3002 that extends in a third direction X2 may be formed on the laminated structure 300 in a second region II of the substrate 100.

The first mask pattern 3001 and the second mask pattern 3002 may be formed of, for example, a material that includes silicon oxide, silicon nitride, or silicon oxynitride.

Figure 11:
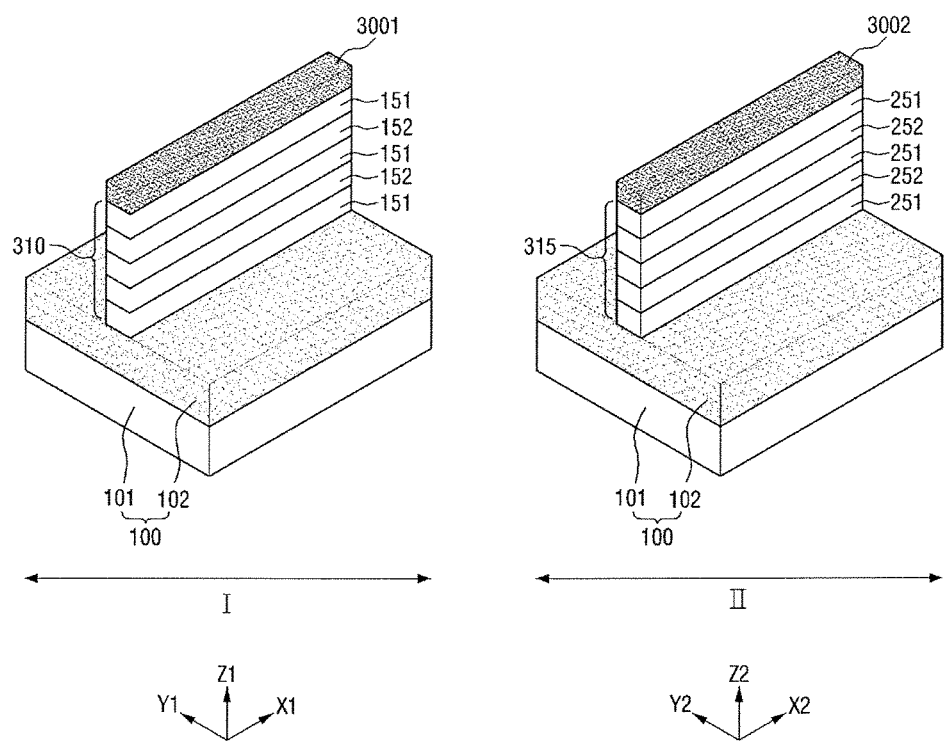

Referring to FIG. 11, a first fin structure 310 and a second fin structure 315 may be formed through etching of the laminated structure 300 using the first mask pattern 3001 and the second mask pattern 3002 as masks. For example, by etching the laminated structure 300 until the upper surface of the substrate 100 is exposed, the first fin structure 310 and the second fin structure 315 may be formed.

The first fin structure 310 may be formed in the first region I, and the second fin structure 315 may be formed in the second region II. The first fin structure 310 may extend lengthwise in the first direction X1, and the second fin structure 315 may extend lengthwise in the third direction X2.

The first fin structure 310 may include a first semiconductor pattern 151 and a second semiconductor pattern 152 that are alternately laminated on the substrate 100, and the second fin structure 315 may include a third semiconductor pattern 251 and a fourth semiconductor pattern 252 that are alternately laminated on the substrate 100.

Since the first semiconductor pattern 151 and the third semiconductor pattern 251 are formed through etching of the first semiconductor layer 301, the first semiconductor pattern 151 and the third semiconductor pattern 251 include the same material. Since the second semiconductor pattern 152 and the fourth semiconductor pattern 252 are formed through etching of the second semiconductor layer 302, the second semiconductor pattern 152 and the fourth semiconductor pattern 252 include the same material.

Then, the first mask pattern 3001 and the second mask pattern 3002, which are positioned on the first fin structure 310 and the second fin structure 315, may be removed.

Figure 12:
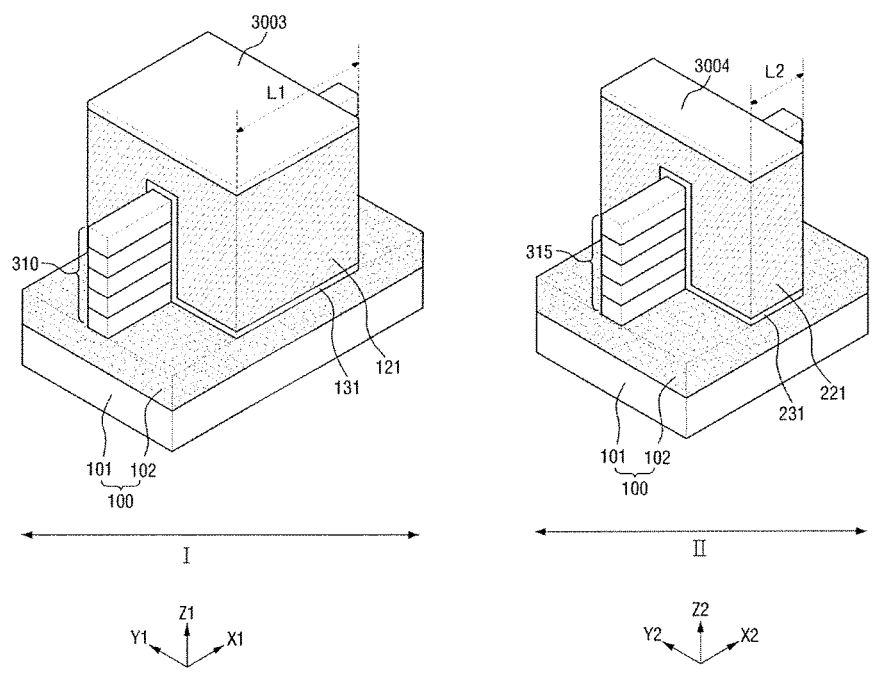

Referring to FIG. 12, a first dummy gate insulating layer 131 and a first dummy gate electrode 121, which extend in a second direction Y1 to cross the first fin structure 310, may be formed through an etching process using a third mask pattern 3003.

A second dummy gate insulating layer 231 and a second dummy gate electrode 221, which extend in a fourth direction Y2 to cross the second fin structure 315, may be formed through an etching process using a fourth mask pattern 3004.

This way, the first dummy gate electrode 121 may be formed on the first fin structure 310, and the second dummy gate electrode 221 may be formed on the second fin structure 315.

The first dummy gate insulating layer 131 and the second dummy gate insulating layer 231 may be made of silicon oxide, and the first dummy gate electrode 121 and the second dummy gate electrode 221 may be made of poly silicon or amorphous silicon. However, the present inventive concept is not limited thereto.

Figure 13:
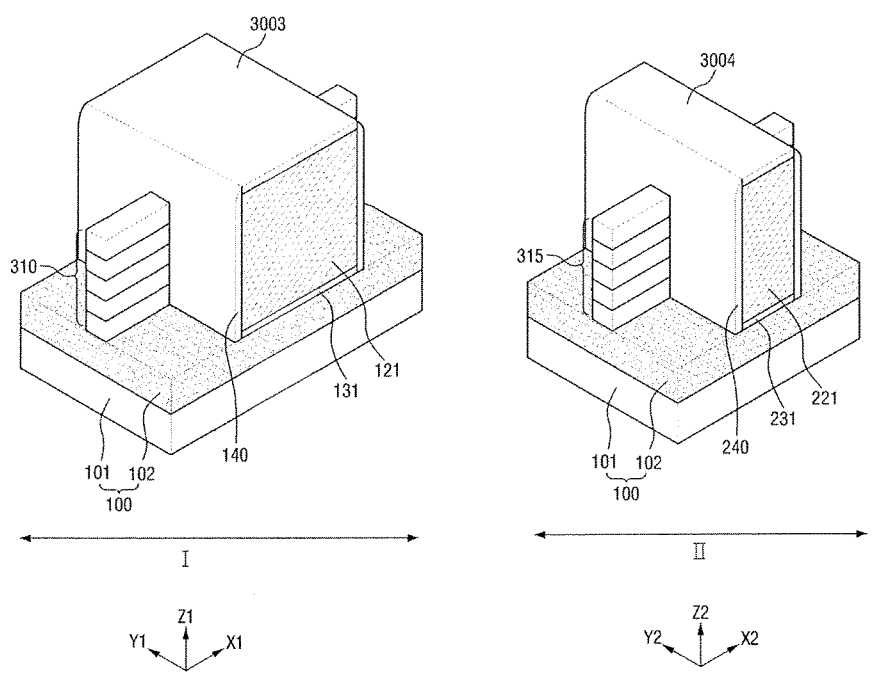

Referring to FIG. 13, a first gate spacer 140 may be formed on side walls of the first dummy gate electrode 121.

Further, a second gate spacer 240 may be formed on side walls of the second dummy gate electrode 221.

A spacer layer which may cover the first dummy gate electrode 121, the second dummy gate electrode 221, the first fin structure 310, and the second fin structure 315, may be formed on the substrate 100. Thereafter, the first gate spacer 140 may be formed on the side walls of the first dummy gate electrode 121 and the second gate spacer 240 may be formed on the side walls of the second dummy gate electrode 221 through etch-back of the spacer layer.

Figure 14:
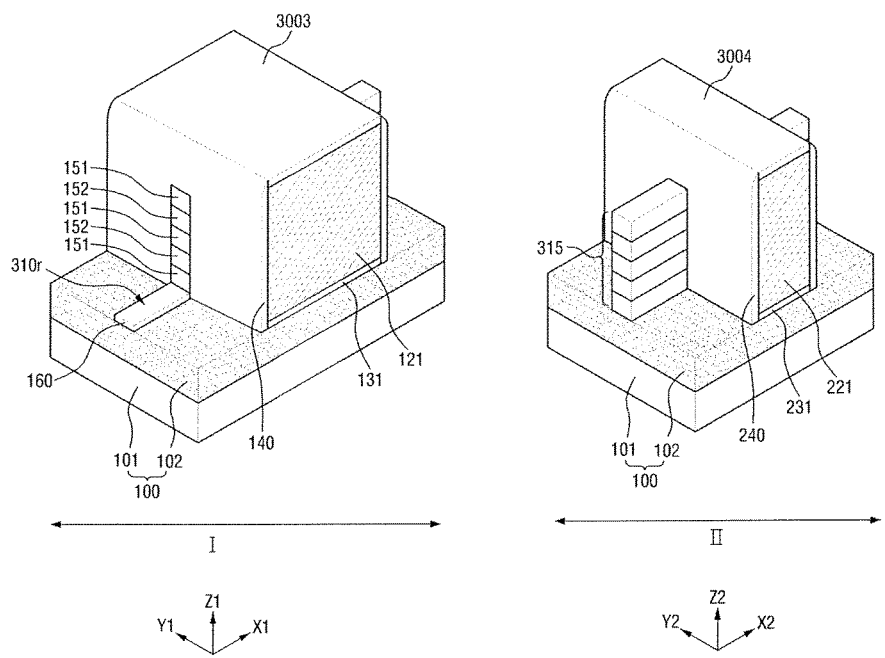

Referring to FIG. 14, a first recess 310r may be formed in the first fin structure 310 through removal of the first fin structure 310 that is exposed on both sides of the first dummy gate electrode 121 and the first gate spacer 140. For example, on one side of the first dummy gate electrode 121 and the first gate spacer 140, almost all of the first fin structure 310 is removed.

After removing most of the first fin structure 310, when the first recess 310r is formed, a first epitaxial seed layer 160 may be formed using a remaining portion of the first fin structure 310. For example, the first epitaxial seed layer 160 may be formed by using a lower first semiconductor pattern 151 that remains on the substrate 100. However, the present inventive concept is not limited thereto. For example, the upper surface of the substrate 100 may be exposed by entirely removing the lowermost first semiconductor pattern 151 that comes in contact with the substrate 100.

The first semiconductor pattern 151 and the second semiconductor pattern 152, which are alternately laminated on the substrate 100, may be exposed through a side surface of the first recess 310r.

When the first recess 310r is formed in the first fin structure 310, the second region II may be covered using a photosensitive film pattern. However, the present inventive concept is not limited thereto.

Figure 15:
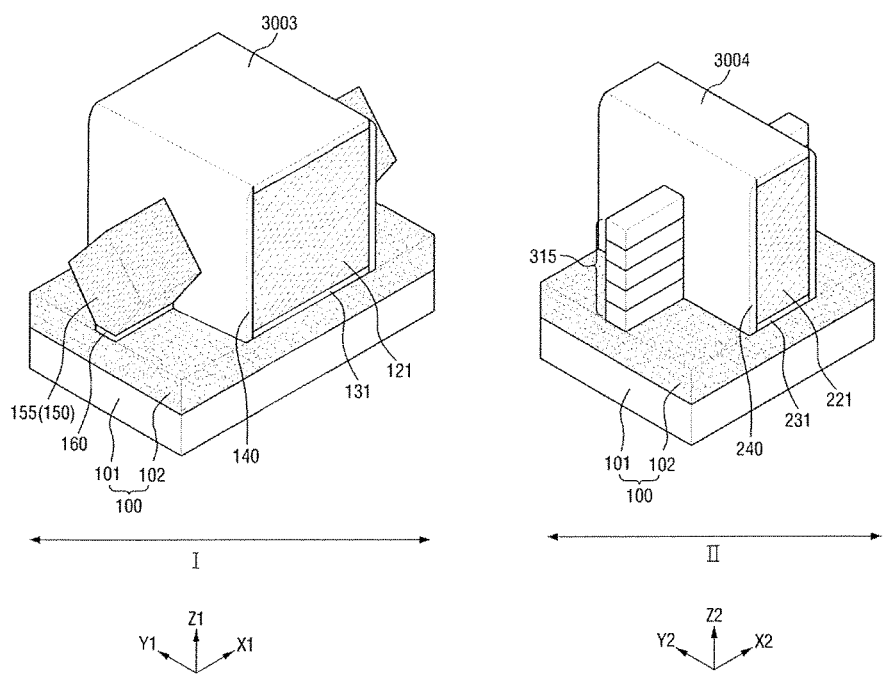

Referring to FIG. 15, a first epitaxial layer 155 that may fill the first recess 310r may be formed on the first fin structure 310. For example, a first source/drain 150 is formed on both sides of the first dummy gate electrode 121.

The first epitaxial layer 155 may be formed using an epitaxial growth method. The first epitaxial layer 155 may be grown using the first epitaxial seed layer 160 and the first and second semiconductor patterns 151 and 152 that are exposed through the side surface of the first recess 310r as seed layers. When the first epitaxial seed layer 160 does not exist, the first epitaxial layer 155 may be grown using the first semiconductor pattern 151 and the second semiconductor pattern 152 that are exposed through the side surface of the first recess 310r as seed layers.

Figure 16:
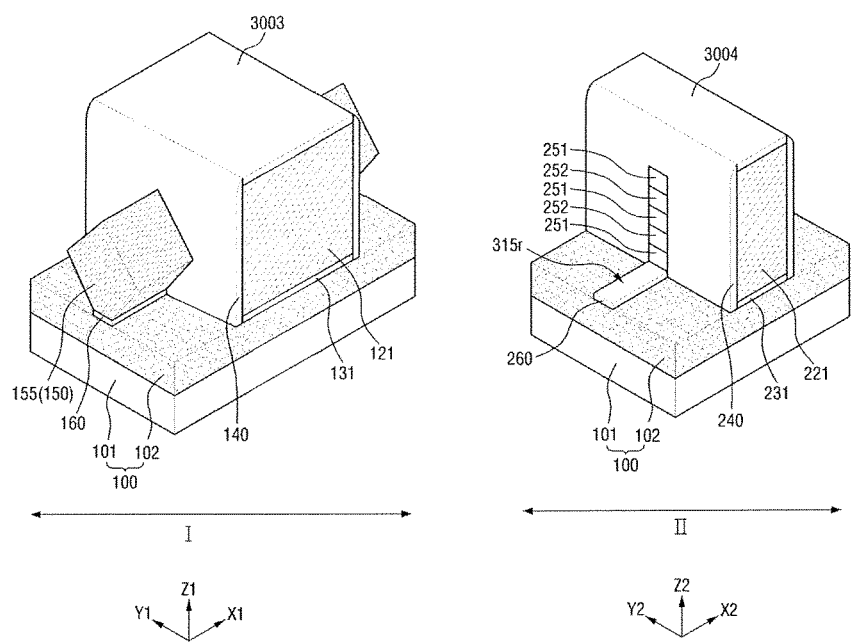

Referring to FIG. 16, a second recess 315r may be formed in the second fin structure 315 through removal of the second fin structure 315 that is exposed on both sides of the second dummy gate electrode 221 and the second gate spacer 240. For example, on one side of the second dummy gate electrode 221 and the second gate spacer 240, almost all of the second fin structure 315 is removed.

After removing most of the second fin structure 315, when the second recess 315r is formed, a second epitaxial seed layer 260 may be formed using a remaining portion of the second fin structure 315. For example, the second epitaxial seed layer 260 may be formed using a lower third semiconductor pattern 251 that remains on the substrate 100. However, the present inventive concept is not limited thereto. For example, the upper surface of the substrate 100 may be exposed by entirely removing the lowermost third semiconductor pattern 251 that comes in contact with the substrate 100.

The third semiconductor pattern 251 and the fourth semiconductor pattern 252, which are alternately laminated on the substrate 100, may be exposed through a side surface of the second recess 315r.

When the second recess 315r is formed in the second fin structure 315, the first region I may be covered using a photosensitive film pattern. However, the present inventive concept is not limited thereto.

Figure 17:
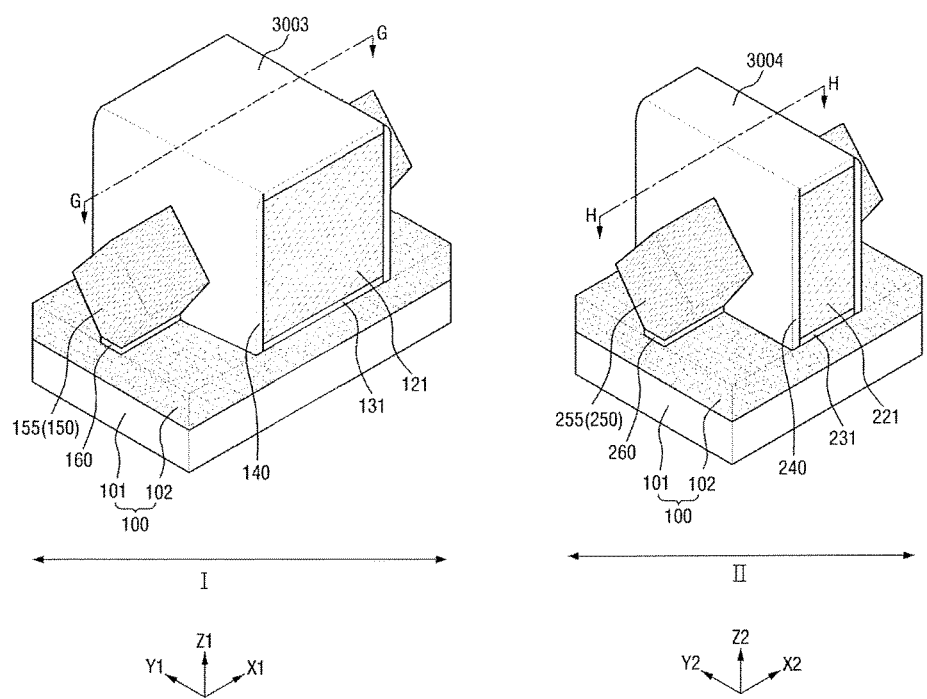
Figure 18:
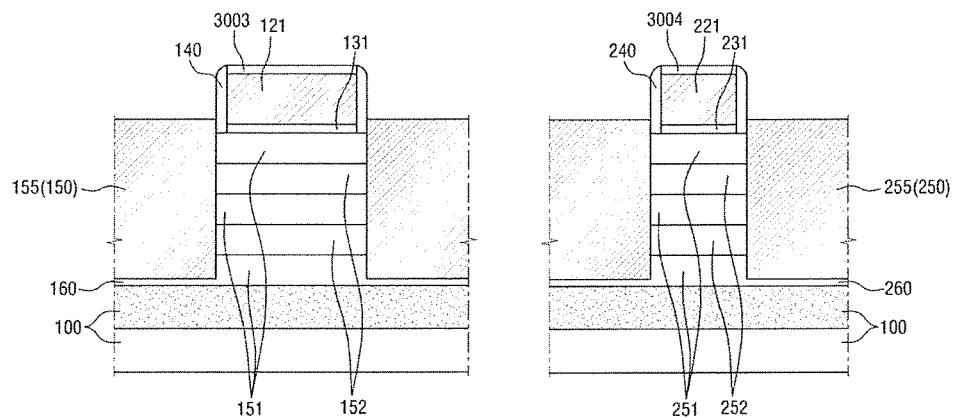

Referring to FIGS. 17 and 18, a second epitaxial layer 255 that may fill the second recess 315r may be formed on the second fin structure 315. For example, a second source/drain 250 may be formed on both sides of the second dummy gate electrode 221.

The second epitaxial layer 255 may be grown using the second epitaxial seed layer 260 and the third and fourth semiconductor patterns 251 and 252 that are exposed through the side surface of the second recess 315r as seed layers. If the second epitaxial seed layer 260 does not exist, the second epitaxial layer 255 may be grown using the third semiconductor pattern 251 and the fourth semiconductor pattern 252 that are exposed through the side surface of the second recess 315r as seed layers.

In FIG. 18, the first epitaxial layer 155 may come in contact with the first semiconductor pattern 151 and the second semiconductor pattern 152 that are positioned on lower portions of the first dummy gate electrode 121 and the first gate spacer 140. The second epitaxial layer 255 may come in contact with the third semiconductor pattern 251 and the fourth semiconductor pattern 252 that are positioned on lower portions of the second dummy gate electrode 221 and the second gate spacer 240.

Figure 19:
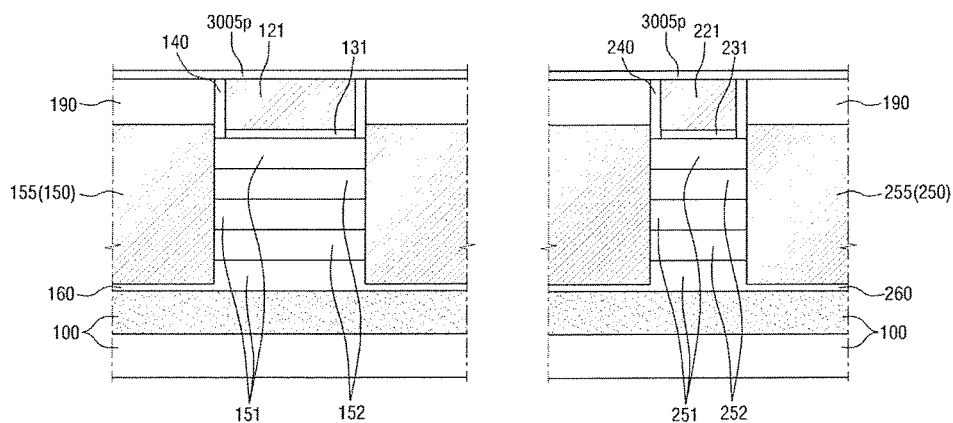

Referring to FIG. 19, an interlayer insulating layer 190, which may cover the first source/drain 150, the second source/drain 250, the first dummy gate electrode 121, the second dummy gate electrode 221, the first gate spacer 140, and the second gate spacer 240, may be formed on the substrate 100.

The interlayer insulating layer 190 may include a low-k material, an oxide layer, a nitride layer, or an oxynitride layer. The low-k material may be, for example, Flowable Oxide (FOX), Tonen SilaZen (TOSZ), Undoped Silica Glass (USG), Borosilica Glass BSG, PhosphoSilaca Glass PSG, BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable Chemical Vapor Deposition (FCVD) oxide, or a combination thereof.

Then, the interlayer insulating layer 190 is planarized until the first dummy gate electrode 121 and the second dummy gate electrode 221 are exposed. As a result, the third mask pattern 3003 and the fourth mask pattern 3004 may be removed, and the upper surface of the first dummy gate electrode 121 and the upper surface of the second dummy gate electrode 221 may be exposed.

Then, a mask layer 3005p that covers the first region I and the second region II may be formed on the interlayer insulating layer 190. Accordingly, the upper surface of the first dummy gate electrode 121 and the upper surface of the second dummy gate electrode 221 may be covered by the mask layer 3005p.

The mask layer 3005p may include, for example, an oxide layer, a nitride layer, or an oxynitride layer.

Figure 20:
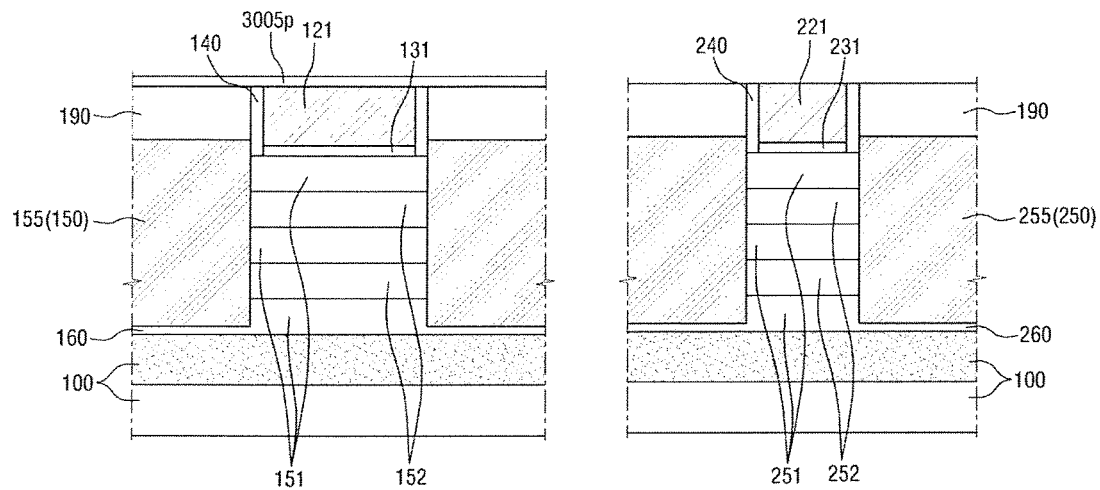

Referring to FIG. 20, the mask layer 3005 is formed only on the first region I through removal of the mask layer 3005p that is formed on the second region II.

As the mask layer 3005p that is formed on the second region II is removed, the upper surface of the second dummy gate electrode 221 may be exposed. Further, the non-removed mask layer 3005p may cover the first dummy gate electrode 121 and the first gate spacer 140.

Figure 21:
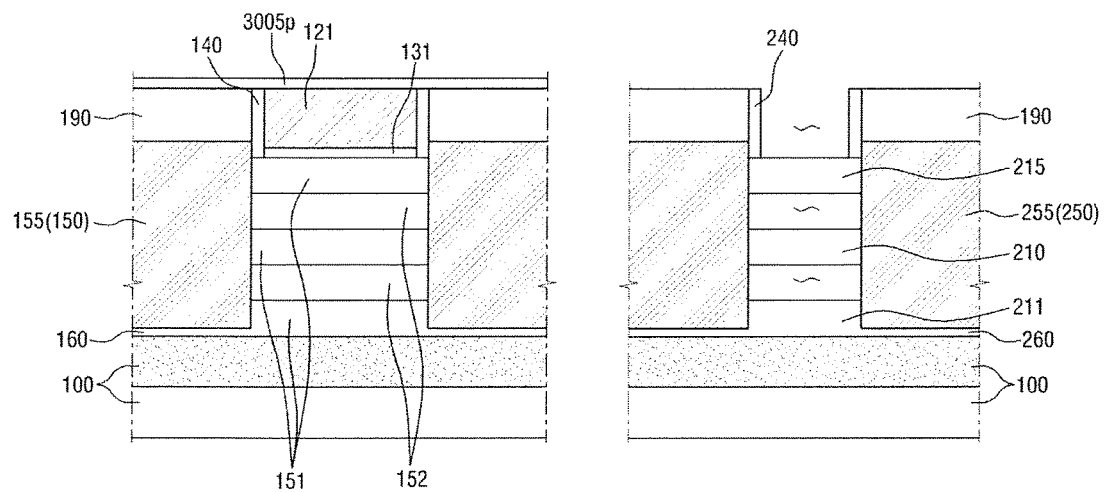

Referring to FIG. 21, the second dummy gate electrode 221 and the second dummy gate insulating layer 231 of the exposed second region II may be successively removed using the mask layer 3005p as a mask.

Then, the fourth semiconductor pattern 252 may be removed using a first etchant, of which the etching rate for the fourth semiconductor pattern 252 is higher than the etching rate for the third semiconductor pattern 251.

This way, a first wire pattern 210 and a third wire pattern 215 composed of the third semiconductor pattern 251 are formed on the second region II. In other words, a first wire pattern group including one or more wire patterns (e.g., the first wire pattern 210 and the third wire pattern 215) is formed on the second region II.

Figure 22:
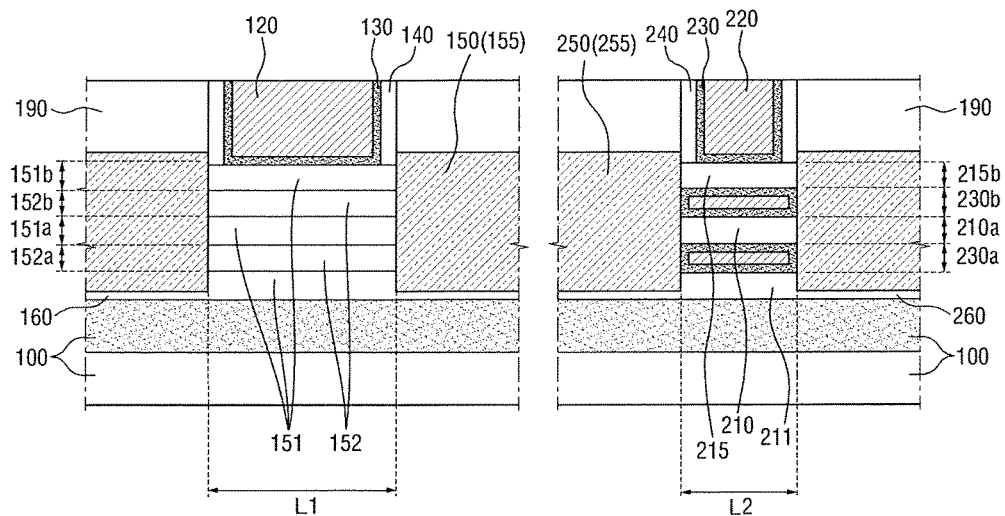

Referring to FIG. 22, a second gate insulating layer 230 may be formed along the circumference of the first wire pattern 210, the circumference of the third wire pattern 215, the side walls of the second gate spacer 240, and the exposed second epitaxial layer 255.

A second gate electrode 220 that entirely surrounds the circumferences of the first wire pattern 210 and the third wire pattern 215 may be formed on the second gate insulating layer 230.

A planarization process may be performed to form the second gate insulating layer 230 and the second gate electrode 220, and through this planarization process, the mask layer 3005p that is formed in the second region I may be removed.

Referring to FIG. 22, a first gate insulating layer 130 may be formed along the upper surface and a side wall of the fin 151 and 152 and the side walls of the first gate spacer 140 in the first region I. Then, the first gate electrode 120 that surrounds the upper surface and the side walls of the fin 151 and 152 may be formed on the first gate insulating layer 130.

Figure 23:
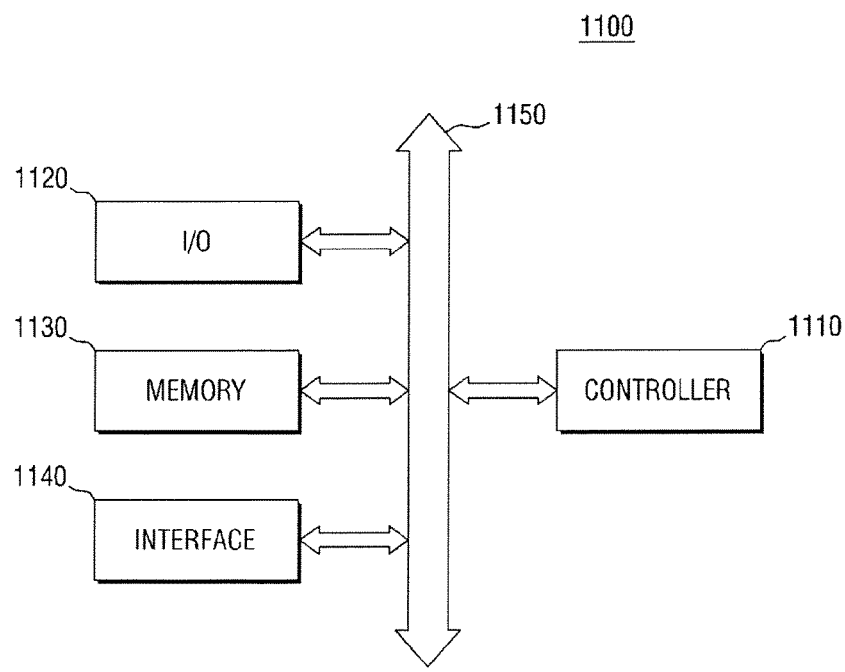
FIG. 23 is a block diagram of an electronic system that includes a semiconductor device, according to an example embodiment of the present inventive concept.

FIG. 23 is a block diagram of an electronic system that includes a semiconductor device according to an example embodiment of the present inventive concept.

Referring to FIG. 23, an electronic system 1100 according to an example embodiment of the present inventive concept may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions to the microprocessor, digital signal processor or microcontroller. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. The electronic system 1100 may further include a high-speed DRAM and/or SRAM as an operating memory for improving the operation of the controller 1110. The semiconductor device according to an example embodiment of the present inventive concept may be provided in the memory 1130, or it may be provided as a part of the controller 1110 or the I/O device 1120.

The electronic system 1100 may be applied to a Personal Digital Assistant (PDA), a portable computer, a web tablet, a wireless phone, a mobile phone, a digital music player, a memory card. The electronic system 1100 may be applied to all electronic devices that can transmit and/or receive information in wireless environments.

Figure 24:
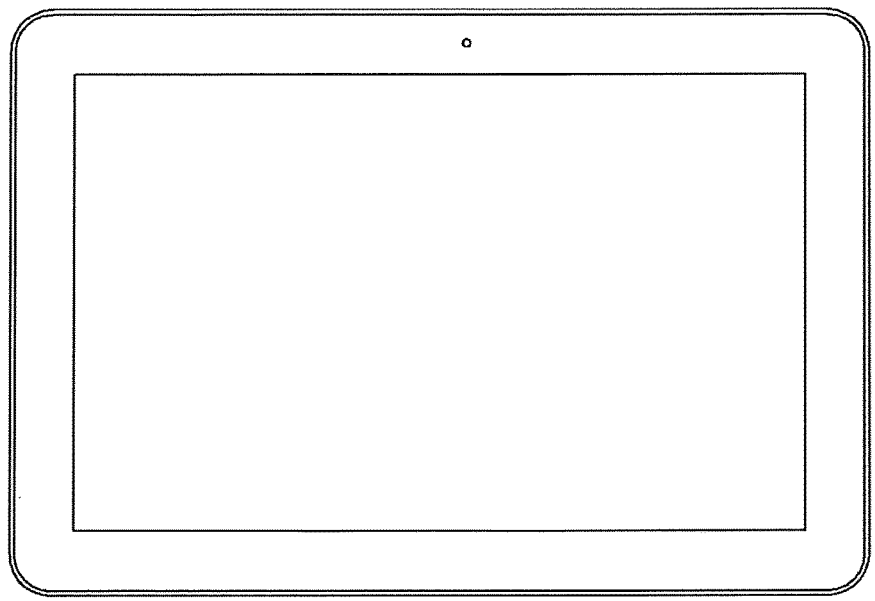
FIGS. 24 and 25 are views of example semiconductor systems to which the semiconductor device according to example embodiments of the present inventive concept can be applied.
Figure 25:
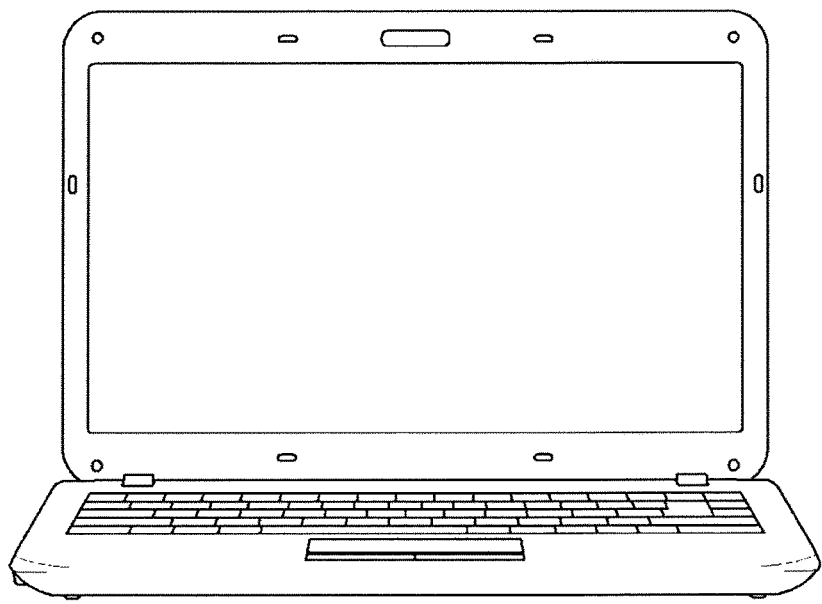

FIGS. 24 and 25 are views of example semiconductor systems to which a semiconductor device, according to example embodiments of the present inventive concept, can be applied. FIG. 24 illustrates a tablet personal computer (PC), and FIG. 25 illustrates a notebook computer. At least one of the semiconductor devices according to example embodiments of the present inventive concept, may be used in the tablet PC or in the notebook computer. At least one of the semiconductor devices according to example embodiments of the present inventive concept can be applied to other integrated circuit devices as well.

While the inventive concept has been particularly shown and described with reference to example embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
a substrate including a first region and a second region;
a fin extending in a first direction in the first region of the substrate, wherein the fin includes a first semiconductor pattern and a second semiconductor pattern that are disposed on each other;
a first wire pattern extending in a second direction in the second region of the substrate;
a first gate electrode disposed on the fin, wherein the first gate electrode extends in a third direction that is different from the first direction; and
a second gate electrode surrounding an outer perimeter of the first wire pattern and extending in a fourth direction that is different from the second direction.

2. The semiconductor device of claim 1, wherein the first semiconductor pattern is disposed at a first height with respect to an upper surface of the substrate, the second semiconductor pattern is disposed at a second height with respect to the upper surface of the substrate, the second height is different from the first height, and the first wire pattern is disposed at the first height and includes the same material as the first semiconductor pattern.

3. The semiconductor device of claim 2, wherein a thickness of the first semiconductor pattern is equal to a thickness of the first wire pattern.

4. The semiconductor device of claim 3, wherein a width in which the first gate electrode and the fin overlap each other is different from a width in which the second gate electrode and the first wire pattern overlap each other.

5. The semiconductor device of claim 4, wherein the width in which the first gate electrode and the fin overlap each other is larger than the width in which the second gate electrode and the first wire pattern overlap each other.

6. The semiconductor device of claim 1, further comprising a first source or drain arranged on first and second sides of the first gate electrode, and a second source or drain arranged on first and second sides of the second gate electrode,
wherein the first source or drain includes an extension portion of the first semiconductor pattern and an extension portion of the second semiconductor pattern, and the second source or drain includes a third semiconductor pattern and a fourth semiconductor pattern that are disposed on each other.

7. The semiconductor device of claim 1, wherein the substrate further includes a third region, and the semiconductor device further comprises a second wire pattern extending in a fifth direction on the third region and a third gate electrode surrounding an outer perimeter of the second wire pattern and extending in a sixth direction that is different from the fifth direction.

8. The semiconductor device of claim 7, wherein the first semiconductor pattern is disposed at a first height with respect to an upper surface of the substrate, the second semiconductor pattern is disposed at a second height with respect to the upper surface of the substrate, the second height is different from the first height, the first wire pattern is disposed at the first height and includes the same material as the first semiconductor pattern, and the second wire pattern is disposed at the second height and includes the same material as the second semiconductor pattern.

9. The semiconductor device of claim 8, wherein the first wire pattern and the second wire pattern include different materials.

10. The semiconductor device of claim 7, wherein a thickness of the first semiconductor pattern is equal to a thickness of the first wire pattern, and a thickness of the second semiconductor pattern is equal to a thickness of the second wire pattern.

11. The semiconductor device of claim 7, wherein a width in which the first gate electrode and the fin overlap each other is different from a width in which the second gate electrode and the first wire pattern overlap each other, and wherein the width in which the first gate electrode and the fin overlap each other is different from a width in which the third gate electrode and the second wire pattern overlap each other.

12. A semiconductor device comprising:
a substrate including a first region and a second region;
a fin extending in a first direction in the first region of the substrate, wherein the fin includes a first semiconductor pattern and a second semiconductor pattern;
a wire pattern extending in a second direction in the second region of the substrate;
a first gate electrode disposed on the fin, wherein the first gate electrode extends in a third direction that is different from the first direction; and
a second gate electrode surrounding an outer perimeter of the wire pattern and extending in a fourth direction that is different from the second direction,
wherein a width of the second gate electrode is different from a width of the first gate electrode.

13. The semiconductor device of claim 12, wherein the width of the first gate electrode is larger than the width of the second gate electrode.

14. The semiconductor device of claim 12, wherein the first semiconductor pattern is disposed at a first height with respect to an upper surface of the substrate, the second semiconductor pattern is disposed at a second height with respect to the upper surface of the substrate, the second height is different from the first height, and the first wire pattern is disposed at the first height and includes the same material as the first semiconductor pattern.

15. The semiconductor device of claim 14, wherein a thickness of the first semiconductor pattern is equal to a thickness of the first wire pattern.

16. A semiconductor device comprising:
a substrate including a first region and a second region;

a fin extending in a first direction in the first region of the substrate, wherein the fin includes a first semiconductor pattern disposed on the substrate, a second semiconductor pattern disposed on the first semiconductor pattern, a third semiconductor pattern disposed on the second semiconductor pattern, a fourth semiconductor pattern disposed on the third semiconductor pattern, and a fifth semiconductor pattern disposed on the fourth semiconductor pattern;

a first wire pattern extending in a second direction in the second region of the substrate;

a first gate electrode disposed on the fin, wherein the first gate electrode extends in a third direction that is different from the first direction; and a second gate electrode surrounding a circumference of the first wire pattern and extending in a fourth direction that is different from the second direction.

17. The semiconductor device of claim 16, wherein the third semiconductor pattern is disposed at a first height with respect to an upper surface of the substrate, the fourth semiconductor pattern is disposed at a second height with respect to the upper surface of the substrate, the second height is different from the first height, and the first wire pattern is disposed at the first height and includes the same material as the third semiconductor pattern.

18. The semiconductor device of claim 16, wherein a width of an area where the first gate electrode and the fin overlap each other is different from a width of an area where the second gate electrode and the first wire pattern overlap each other.

19. The semiconductor device of claim 16, further comprising a first source or drain arranged on first and second sides of the first gate electrode, and a second source or drain arranged on first and second sides of the second gate electrode, wherein the first source or drain includes an extension portion of the first semiconductor pattern, an extension portion of the second semiconductor pattern, an extension portion of the third semiconductor pattern, an extension portion of the fourth semiconductor pattern, and an extension portion of the fifth semiconductor pattern, and the second source or drain includes a sixth semiconductor pattern and a seventh semiconductor pattern disposed on the sixth semiconductor pattern.

20. The semiconductor device of claim 16, wherein the semiconductor device further comprises a second wire pattern extending in a fifth direction on a third region of the substrate and a third gate electrode surrounds a circumference of the second wire pattern and extends in a sixth direction that is different from the fifth direction.

* * * * *